US012777877B2

(12) United States Patent
Nishiyama et al.

(10) Patent No.: US 12,777,877 B2
(45) Date of Patent: Oct. 27, 2026

(54) SEMICONDUCTOR MANUFACTURING APPARATUS AND METHOD FOR MANUFACTURING A SEMICONDUCTOR MANUFACTURING APPARATUS

(71) Applicant: Mitsubishi Electric Corporation, Tokyo (JP)

(72) Inventors: Masayuki Nishiyama, Tokyo (JP); Naoki Yoshimatsu, Tokyo (JP); Rei Yoneyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 359 days.

(21) Appl. No.: 18/471,920

(22) Filed: Sep. 21, 2023

(65) Prior Publication Data

US 2024/0258134 A1 Aug. 1, 2024

(30) Foreign Application Priority Data

Jan. 31, 2023 (JP) ................................ 2023-013151

(51) Int. Cl.
*H10P 72/00* (2026.01)
*B23K 26/402* (2014.01)
(Continued)

(52) U.S. Cl.
CPC ........ *H10P 72/0441* (2026.01); *B23K 26/402* (2013.01); *B23K 26/53* (2015.10);
(Continued)

(58) Field of Classification Search
CPC . H10W 40/20; H10W 40/235; H10W 40/231; H10W 70/041; H10W 70/442
See application file for complete search history.

(56) References Cited

U.S. PATENT DOCUMENTS

| | | | |
|---|---|---|---|
| 2007/0172980 A1 | 7/2007 | Tanaka et al. | |
| 2011/0037166 A1 | 2/2011 | Ikeda et al. | |

(Continued)

FOREIGN PATENT DOCUMENTS

| | | | |
|---|---|---|---|
| DE | 10 2020 211 192 A1 | | 3/2022 |
| DE | 102020211192 | * | 3/2022 |

(Continued)

OTHER PUBLICATIONS

"Notice of Reasons for Refusal" Office Action issued in JP 2023-013151; mailed by the Japanese Patent Office on Jan. 6, 2026.

*Primary Examiner* — Matthew L Reames
(74) *Attorney, Agent, or Firm* — Studebaker Brackett PLLC

(57) ABSTRACT

A semiconductor manufacturing apparatus of the present disclosure includes a semiconductor module having a semiconductor device, a sealing material adapted to seal the semiconductor module, and a second terminal to be arranged outside the sealing material. The semiconductor module includes a first terminal electrically connected to the semiconductor device and extending to the outside of the sealing material. The first terminal is joined to the second terminal outside the sealing material. The thickness of the second terminal in a direction perpendicular to a joined face of the first terminal and the second terminal is defined as the thickness of the second terminal. The thickness of the first terminal at a portion extending from the sealing material in the direction perpendicular to the joined face is defined as the thickness of the first terminal. The thickness of the second terminal is greater than the thickness of the first terminal.

11 Claims, 7 Drawing Sheets

(51) Int. Cl.

| | |
|---|---|
| ***B23K 26/53*** | (2014.01) |
| ***B23K 101/40*** | (2006.01) |
| ***H10P 34/42*** | (2026.01) |
| ***H10W 40/20*** | (2026.01) |
| ***H10W 70/04*** | (2026.01) |
| ***H10W 70/40*** | (2026.01) |
| ***H10W 72/00*** | (2026.01) |
| ***H10W 72/50*** | (2026.01) |

(52) U.S. Cl.
CPC .......... *H10P 34/42* (2026.01); *H10W 40/231* (2026.01); *H10W 40/235* (2026.01); *H10W 70/041* (2026.01); *H10W 70/442* (2026.01); *H10W 72/075* (2026.01); *H10W 72/50* (2026.01); *B23K 2101/40* (2018.08)

(56) References Cited

U.S. PATENT DOCUMENTS

| | | | |
|---|---|---|---|
| 2013/0267064 | A1 | 10/2013 | Ikeda et al. |
| 2021/0407875 | A1 | 12/2021 | Miwa et al. |
| 2021/0407954 | A1 | 12/2021 | Yoshihara |
| 2022/0302071 | A1 | 9/2022 | Fuji |

FOREIGN PATENT DOCUMENTS

| | | | |
|---|---|---|---|
| JP | 2007-227893 | A | 9/2007 |
| JP | 2020-150020 | A | 9/2020 |
| WO | 2009/125779 | A1 | 10/2009 |
| WO | 2020/105476 | A1 | 5/2020 |
| WO | 2020/255663 | A1 | 12/2020 |

* cited by examiner

SEMICONDUCTOR MANUFACTURING APPARATUS AND METHOD FOR MANUFACTURING A SEMICONDUCTOR MANUFACTURING APPARATUS

BACKGROUND OF THE INVENTION

Field

The present disclosure relates to a semiconductor manufacturing apparatus and a method for manufacturing a semiconductor manufacturing apparatus.

Background

JP 2020-150020 A discloses a technique for suppressing the temperature of each terminal, which protrudes from a sealing resin body sealing a semiconductor device, when a current is flowed therethrough by changing the width of the terminal.

SUMMARY

However, the foregoing method of changing the width of each terminal has a limitation in reducing the temperature of the terminal due to restrictions on the terminal in the thickness direction.

To solve the foregoing problem, it is a primary object of the present disclosure to provide a semiconductor manufacturing apparatus that can suppress a temperature rise of the apparatus by devising the shapes of terminals.

It is a secondary object of the present disclosure to provide a method for manufacturing a semiconductor manufacturing apparatus that can suppress a temperature rise of the apparatus by devising the shapes of terminals.

The features and advantages of the present disclosure may be summarized as follows.

According to one aspect of the present disclosure, a semiconductor manufacturing apparatus comprises a semiconductor module including a semiconductor device, a sealing material adapted to seal the semiconductor module, and a second terminal to be arranged outside the sealing material. The semiconductor module includes a first terminal that is electrically connected to the semiconductor device and extends to outside of the sealing material, and the first terminal is joined to the second terminal outside the sealing material. A thickness of the second terminal in a direction perpendicular to a joined face of the first terminal and the second terminal is defined as a thickness of the second terminal, and a thickness of the first terminal at a portion extending from the sealing material in the direction perpendicular to the joined face is defined as a thickness of the first terminal. The thickness of the second terminal is greater than the thickness of the first terminal.

According to another aspect of the present disclosure, a method for manufacturing a semiconductor manufacturing apparatus, comprises a first step of sealing a semiconductor module including a semiconductor device using a sealing material; and a second step of joining a first terminal that is electrically connected to the semiconductor device and extends to outside of the sealing material to a second terminal arranged outside the sealing material, thereby electrically connecting the first terminal and the second terminal. A thickness of the second terminal in a direction perpendicular to a joined face of the first terminal and the second terminal is defined as a thickness of the second terminal, and a thickness of the first terminal at a portion extending from the sealing material in the direction perpendicular to the joined face is defined as a thickness of the first terminal. The thickness of the second terminal is greater than the thickness of the first terminal.

Other and further objects, features and advantages of the invention will appear more fully from the following description.

DESCRIPTION OF EMBODIMENTS

First Embodiment

Figure 1:
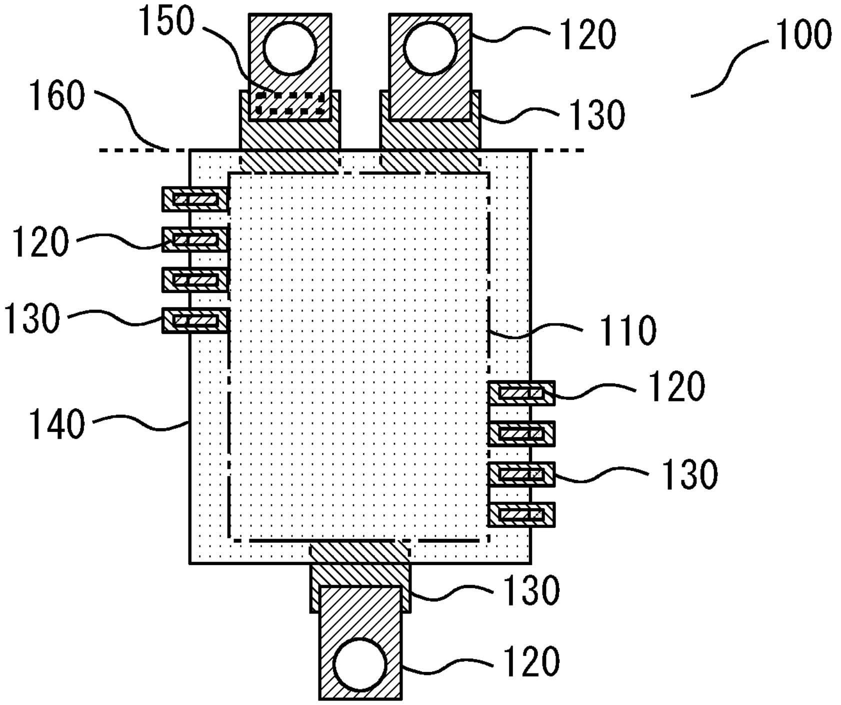
FIG. 1 is a top view of a semiconductor manufacturing apparatus according to a first embodiment of the present disclosure.

FIG. 1 is a top view of a semiconductor manufacturing apparatus 100 according to a first embodiment of the present disclosure. The semiconductor manufacturing apparatus 100 includes a semiconductor module 110, a sealing material 140, and a plurality of second terminals 120.

The sealing material 140 is adapted to seal the semiconductor module 110. The material of the sealing material 140 is desirably the one that can improve the reliability of the semiconductor module 110. For example, a thermosetting resin material is used. As a sealing method, transfer molding is used, for example.

The semiconductor module 110 is sealed with the sealing material 140. The semiconductor module 110 includes a plurality of first terminals 130. The first terminals 130 are terminals for electrically connecting the semiconductor module 110 to the second terminals 120. The first terminals 130 are extended to the outside of the sealing material 140 so as to be joined to the respective second terminals 120 outside the sealing material 140. Joining the corresponding terminals outside the sealing material 140 can suppress the self-heating of the terminals when a current is flowed therethrough, and thus can suppress a temperature rise of the semiconductor manufacturing apparatus 100. For the joining, laser welding is used.

The first terminals 130 are broadly classified into main terminals and signal terminals. Each main terminal is electrically connected to an emitter electrode or a collector electrode of each semiconductor device 111 included in the semiconductor module 110. Meanwhile, each signal terminal is electrically connected to a signal input portion of each semiconductor device 111. The signal input portion is a gate electrode, for example. For each of the main terminals and the signal terminals, a copper material with a thickness of 0.64 mm may be used, for example.

The second terminals 120 are arranged outside the sealing material 140, and are joined to the respective first terminals 130 of the semiconductor module 110. For the second terminals 120, a material with a high heat capacity is preferably used. For example, copper is used.

In FIG. 1, a joined face 150 of each first terminal 130 and each second terminal 120 is indicated by a dotted frame line. Hereinafter, a direction perpendicular to the joined face 150 shall be referred to as the thickness direction of each first terminal 130 and each second terminal 120. Further, in FIG. 1, a boundary portion 160 between the first terminals 130 and the sealing material 140 is indicated by a dotted line. Hereinafter, a direction perpendicular to the boundary portion 160 shall be referred to as the lengthwise direction of each first terminal 130 and each second terminal 120. Further, a direction that is horizontal to the boundary portion 160 and is perpendicular to the lengthwise direction shall be referred to as the width direction of each first terminal 130 and each second terminal 120. In addition, provided that cutting is performed along the dotted line indicating the boundary portion 160 in FIG. 1 in a direction perpendicular to the sheet surface, the cut plane of each first terminal 130 and each second terminal 120 corresponds to the cross-section of each first terminal 130 and each second terminal 120. This point is common to all of the following embodiments.

Figure 2:
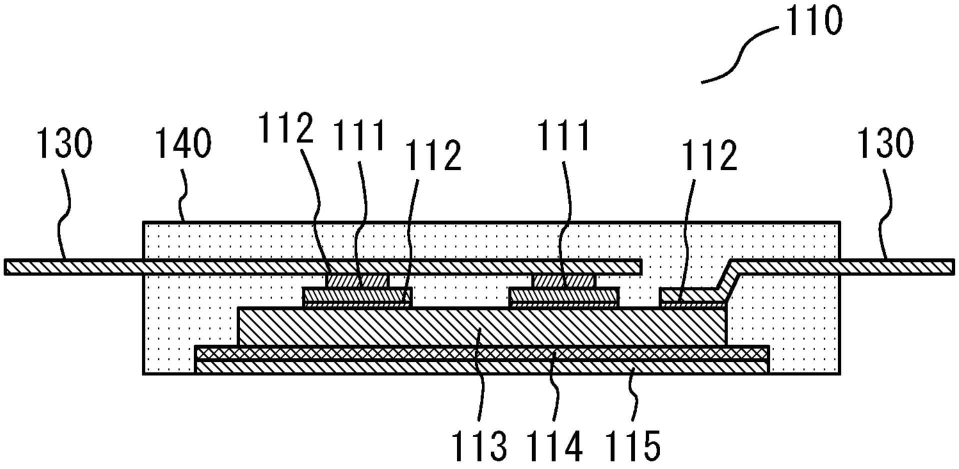
FIG. 2 is a cross-sectional view of the semiconductor module mounted on the semiconductor manufacturing apparatus according to the first embodiment of the present disclosure.

FIG. 2 is a cross-sectional view of the semiconductor module 110 mounted on the semiconductor manufacturing apparatus 100 according to the first embodiment of the present disclosure. Each semiconductor device 111 is a RC-IGBT (Reverse Conducting Insulated Gate Bipolar Transistor) of Si or a MOSFET (Metal-Oxide-Semiconductor Field Effect Transistor) of SiC, for example.

The semiconductor device 111 is not limited to the one formed of silicon, and may be the one formed of a wide-band-gap semiconductor with a band gap wider than that of silicon. Examples of the wide-band-gap semiconductor include silicon carbide, a gallium nitride-based material, and diamond. A semiconductor device formed of such a wide-band-gap semiconductor has a high withstand voltage and high tolerable current density, and thus can be reduced in size. Using such a semiconductor device with a reduced size can also achieve a reduction in the size and an increase in the integration degree of the semiconductor manufacturing apparatus 100 incorporating the semiconductor device. In addition, since the semiconductor device has high heat resistance, radiating fins of a heat sink can be reduced in size, and a water-cooled portion can be formed as an air-cooled portion. Thus, the semiconductor manufacturing apparatus 100 can be further reduced in size. Further, since the semiconductor device has a low power loss and thus has high efficiency, the semiconductor manufacturing apparatus 100 can also be increased in efficiency. Although all of the semiconductor devices 111 are desirably formed of a wide-band-gap semiconductor, it is acceptable as long as one of the semiconductor devices 111 is formed of a wide-band-gap semiconductor, and the advantageous effects described in the present embodiment can be obtained even with such a configuration. This point is also common to all of the following embodiments.

A jointing material 112 is arranged between each semiconductor device 111 and a metal pattern 113, between each semiconductor device 111 and each first terminal 130, and between each first terminal 130 and the metal pattern 113. The jointing material 112 is preferably a member with high electrical conductivity and high thermal conductivity. For example, using lead-free solder, which has the role of a buffer material for reducing stress in addition to the foregoing characteristics, can improve the reliability of the semiconductor manufacturing apparatus 100. Besides, sintered silver may be used.

To design the heat radiation of the metal pattern 113, using a copper material with high thermal conductivity can improve the heat radiation property. For example, using copper with a thickness of 3 mm can diffuse heat in a direction perpendicular to the thickness direction, and thus can efficiently radiate heat. However, the thickness is not limited thereto, and copper with a thickness of 0.8 mm or 0.25 mm may also be used.

An insulating layer 114 is arranged between the metal pattern 113 and a metal member 115. Using the insulating layer 114 made of a resin that is resistant to deformation can suppress the generation of cracks even when small deformation of the member has occurred due to the heat cycle, for example. In addition, using a material with high thermal conductivity can improve the property of radiating heat from the metal pattern 113 to the metal member 115 via the insulating layer 114, and thus can suppress a temperature rise of the semiconductor manufacturing apparatus 100. For example, the insulating layer 114 is a resin containing highly thermal conductive fillers and having a thermal conductivity of greater than or equal to 10 W/m□K. The material of the insulating layer 114 is not limited to a resin, and any one of AlN, Al2O3, and Si3N4 may be used.

To design the heat radiation of the metal member 115, using a copper material with high thermal conductivity can improve the heat radiation property. For example, a copper foil with a thickness of 0.105 mm is used.

Figure 3:
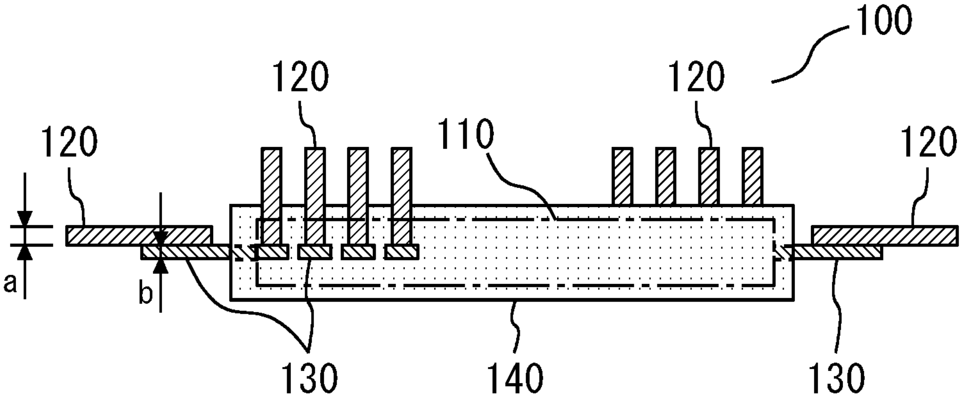
FIG. 3 is a side view of the semiconductor manufacturing apparatus according to the first embodiment of the present disclosure.

FIG. 3 is a side view of the semiconductor manufacturing apparatus 100 according to the first embodiment of the present disclosure. In the semiconductor manufacturing apparatus 100, the thickness a of each second terminal 120 is greater than the thickness b of each first terminal 130. Accordingly, the area of the cross-section of each second terminal 120 can be made larger than the area of the cross-section of each first terminal 130, and thus, the thermal inductance of each second terminal 120 can be made higher than the thermal inductance of each first terminal 130. Consequently, heat generated by the semiconductor module 110 can be efficiently radiated toward the second terminals 120.

It should be noted that the thickness a of each second terminal 120 is the thickness of the second terminal 120 in a direction perpendicular to the joined face where the second terminal 120 is joined to each first terminal 130. In addition, the thickness b of each first terminal 130 is the thickness of the first terminal 130 at a portion extending from the sealing material 140 in the direction perpendicular to the joined face.

Herein, it is also possible to set the width of each second terminal 120 to be greater than the width of each first terminal 130 to make the area of the cross-section of each second terminal 120 to be larger than the area of the cross-section of each first terminal 130. However, since it is often the case that each first terminal 130 is placed on each second terminal 120 during the manufacturing steps, the width of each second terminal 120 is preferably smaller than the width of each first terminal 130 from the perspective of workability.

Thus, in the present disclosure, the thickness of each terminal is adjusted so that the area of the cross-section of the terminal is adjusted. This can improve the workability in the manufacturing steps and the heat radiation property of the semiconductor manufacturing apparatus 100 at the same time.

Second Embodiment

Figure 4:
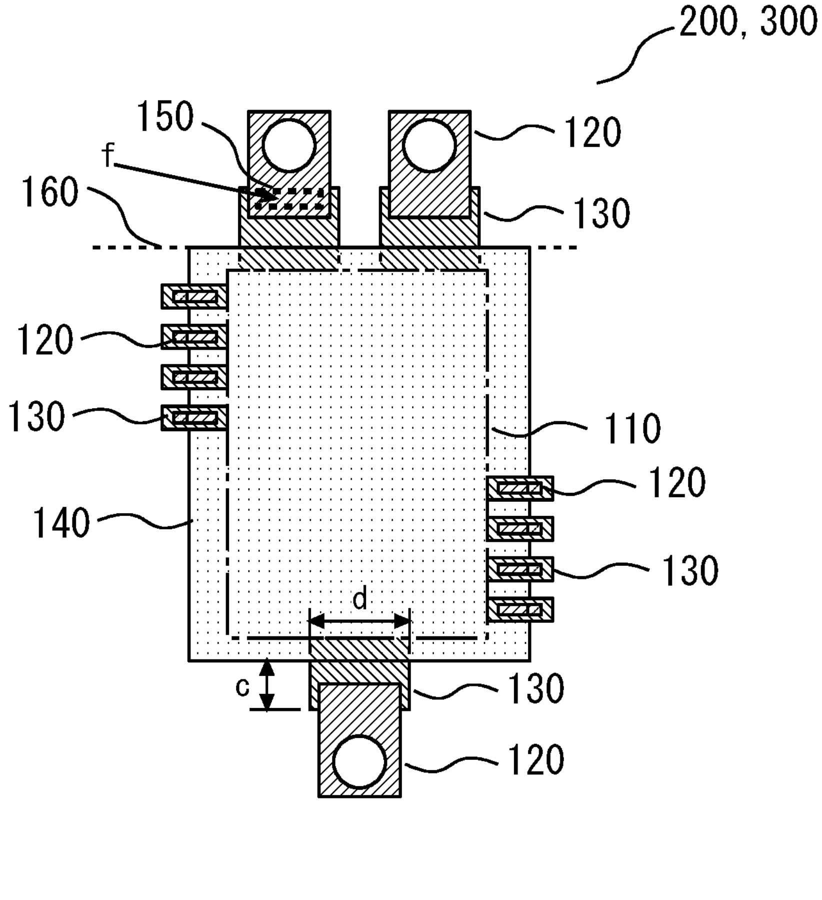
FIG. 4 is a top view of a semiconductor manufacturing apparatus according to a second embodiment of the present disclosure.

FIG. 4 is a top view of a semiconductor manufacturing apparatus 200 according to a second embodiment of the present disclosure.

Figure 5:
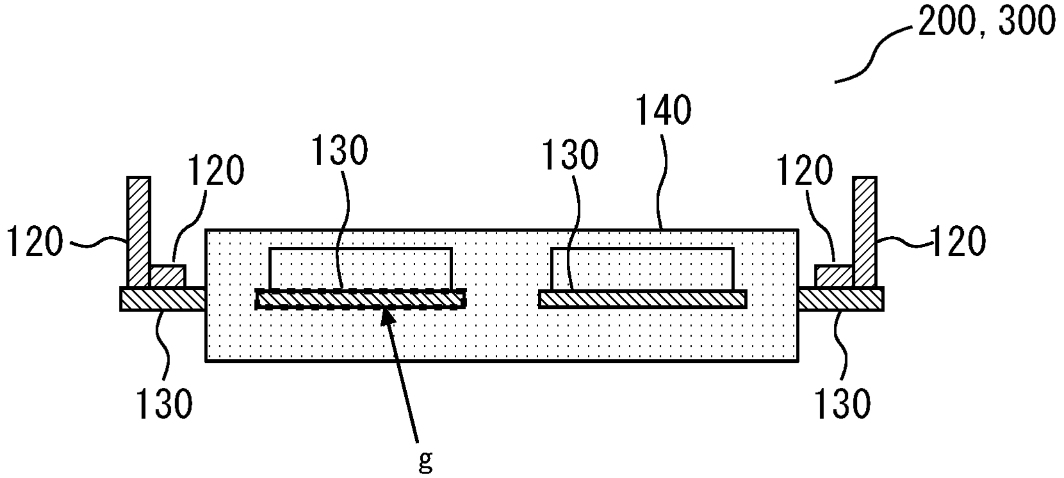
FIG. 5 is a side view of the semiconductor manufacturing apparatus according to the second embodiment of the present disclosure.

FIG. 5 is a side view of the semiconductor manufacturing apparatus 200 according to the second embodiment of the present disclosure. In the present embodiment, the length c of each first terminal 130 is set shorter than the width d of the first terminal 130 (d>c). It should be noted that the length c of each first terminal 130 is the length of the first terminal 130 at a portion extending from the sealing material 140 in a region from the boundary portion 160 to the distal end of the first terminal 130. Similarly, the width d of each first terminal 130 is the width of the first terminal 130 at its extending portion in a direction that is horizontal to the boundary portion 160 and is perpendicular to the direction of the length.

Herein, the thermal resistivity of each first terminal 130 becomes higher in proportion to the length c of the first terminal 130, and is inversely proportional to the area g of its cross-section (hereinafter referred to as a cross-sectional area g). That is, as the length c is greater and the cross-sectional area g is smaller, the amount of heat generated by the first terminal 130 when a current is flowed therethrough would increase. Since the cross-sectional area g of the first terminal 130 is represented by the product of the width d and the thickness b (d×b), it is preferable to increase the width d to increase the cross-sectional area g. Setting the width d of the first terminal 130 to be greater than the length c can cancel the thermal resistivity generated in proportion to the length c.

As described in the first embodiment, the width of each second terminal 120 is preferably set smaller than the width d of each first terminal 130 from the perspective of workability. That is, the area (c×d) of the upper surface of each first terminal 130 is preferably set larger than the area f of the joined face 150 of each first terminal 130 and each second terminal 120. That is, c×d>f is preferably satisfied.

Thus, for each first terminal 130, c×d>f and d>c are more preferably satisfied.

Third Embodiment

The drawings of the present embodiment are common to those of the second embodiment. In a semiconductor manufacturing apparatus 300 of the present embodiment, the cross-sectional area g=d×b of the extending portion of each first terminal 130 is set smaller than the area f of the joined face 150 of each first terminal 130 and each second terminal 120 (f>g).

As described in the first embodiment, each first terminal 130 and each second terminal 120 are joined together by laser welding. Setting the cross-sectional area g=d×b of each first terminal 130 to be smaller than the area f of the joined face 150 can suppress the transmission of heat, which is applied to the to-be-joined portion during welding, to each semiconductor device 111 within the sealing material 140 via the first terminal 130.

Fourth Embodiment

Figure 6:
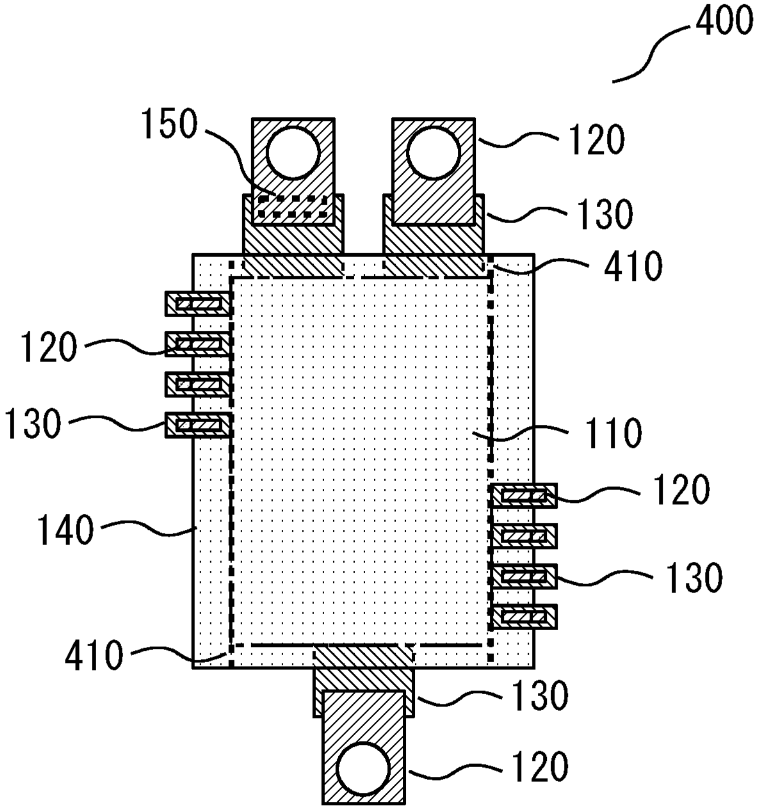
FIG. 6 is a top view of a semiconductor manufacturing apparatus according to a fourth embodiment of the present disclosure.

FIG. 6 is a top view of a semiconductor manufacturing apparatus 400 according to a fourth embodiment of the present disclosure.

Figure 7:
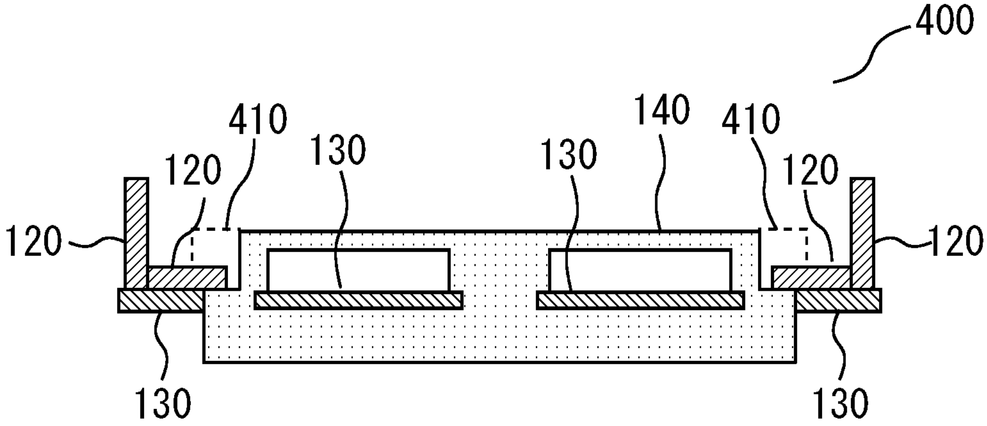
FIG. 7 is a side view of the semiconductor manufacturing apparatus according to the fourth embodiment of the present disclosure.

FIG. 7 is a side view of the semiconductor manufacturing apparatus 400 according to the fourth embodiment of the present disclosure. The sealing material 140 of the semiconductor manufacturing apparatus 400 of the present embodiment is provided with a groove portion 410 for securing a distance from the joined face 150. Accordingly, terminals with a higher heat capacity can be joined together, and thus, a temperature rise of the semiconductor manufacturing apparatus 400 can be suppressed. Further, since a portion of each first terminal 130 exposed from the sealing material 140 can be increased, it is possible to join each first terminal 130 and each second terminal 120 together at a position close to the central portion of the semiconductor module 110. Consequently, the size of the semiconductor manufacturing apparatus 400 can be reduced.

Fifth Embodiment

Figure 8:
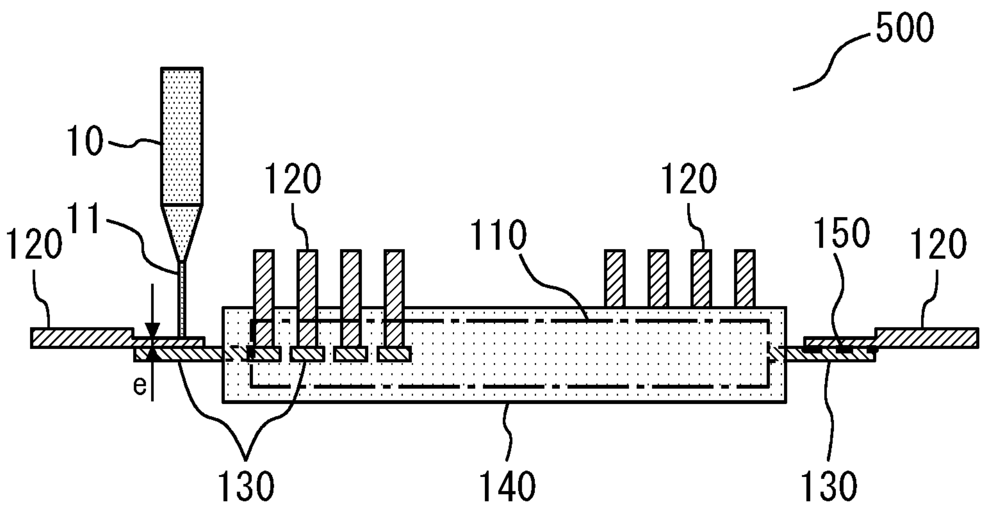
FIG. 8 is a side view of a semiconductor manufacturing apparatus according to a fifth embodiment of the present disclosure.

FIG. 8 is a side view of a semiconductor manufacturing apparatus 500 according to a fifth embodiment of the present disclosure. The thickness e of a region of each second terminal 120 including the joined face 150 (hereinafter referred to as a joined region) is smaller than the thickness of the other region of the second terminal 120 in contact with the joined region. This can reduce the output of a beam 11 when each first terminal 130 and each second terminal 120 are welded together with a laser 10, and thus can reduce the heat flowing into the semiconductor module 110.

Sixth Embodiment

Figure 9:
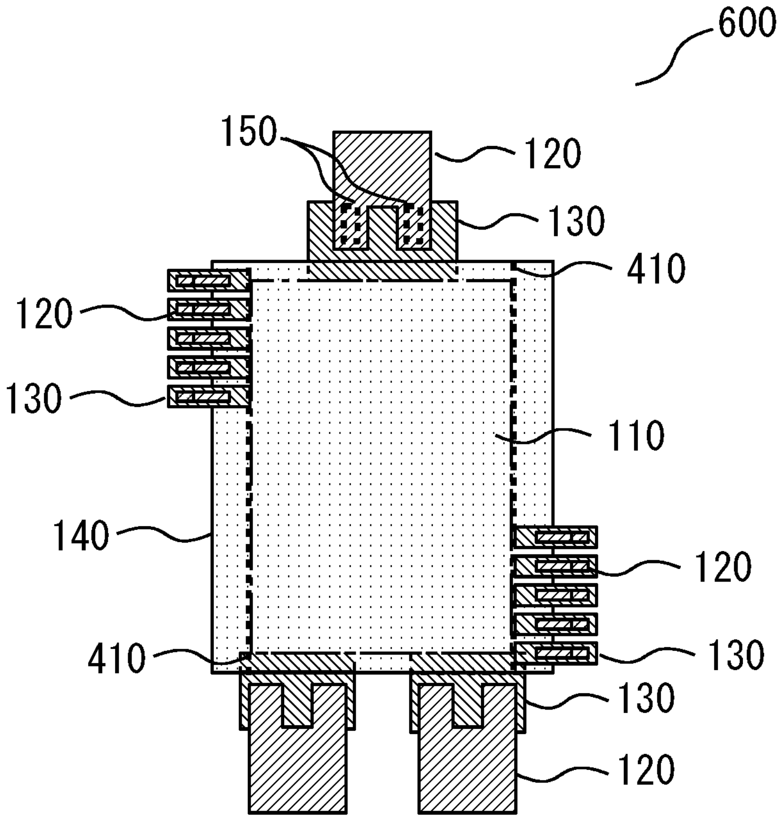
FIG. 9 is a top view of a semiconductor manufacturing apparatus according to a sixth embodiment of the present disclosure.

FIG. 9 is a top view of a semiconductor manufacturing apparatus 600 according to a sixth embodiment of the present disclosure.

Each second terminal 120 is partially cut off on the side of the joined face 150, and thus has a U-shape. This can reduce the heat capacity of each second terminal 120, and thus can reduce the heat flowing into the semiconductor module 110.

Modified Example

The shape of each second terminal 120 is not limited to a U-shape, and it is acceptable as long as each second terminal 120 is partially cut off on the side of the joined face where the second terminal 120 is joined to each first terminal 130.

Seventh Embodiment

Figure 10:
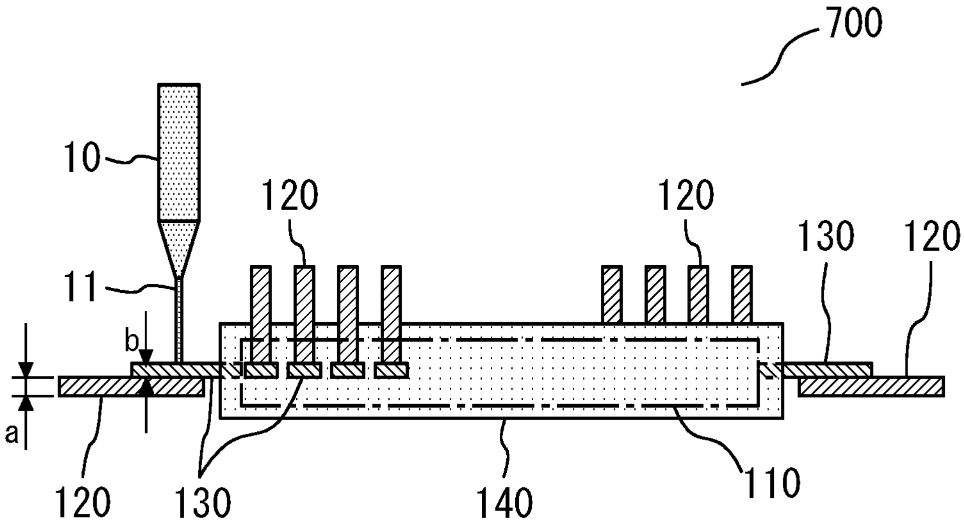
FIG. 10 is a view illustrating a method for manufacturing a semiconductor manufacturing apparatus according to a seventh embodiment of the present disclosure.

FIG. 10 is a view illustrating a method for manufacturing a semiconductor manufacturing apparatus 700 according to a seventh embodiment of the present disclosure. Manufacturing steps for the semiconductor manufacturing apparatus 700 include a first step of sealing the semiconductor module 110 including the semiconductor devices 111 using the sealing material 140. Further, the manufacturing steps include a second step of joining each first terminal 130, which is electrically connected to each semiconductor device 111 and extends to the outside of the sealing material 140, to each second terminal 120 arranged outside the sealing material 140, to electrically connect the first terminal 130 and the second terminal 120.

In the second step, laser joining is performed by emitting the beam 11 of the laser 10 from the side of the first terminal 130. Performing laser welding from the side of the first terminal 130, which is thinner than the second terminal 120, can reduce the output of the beam 11. This can reduce the heat flowing into the semiconductor module 110. In the semiconductor manufacturing apparatus 700, the thickness a of each second terminal 120 is greater than the thickness b of each first terminal 130 as in the first embodiment.

Eighth Embodiment

Figure 11:
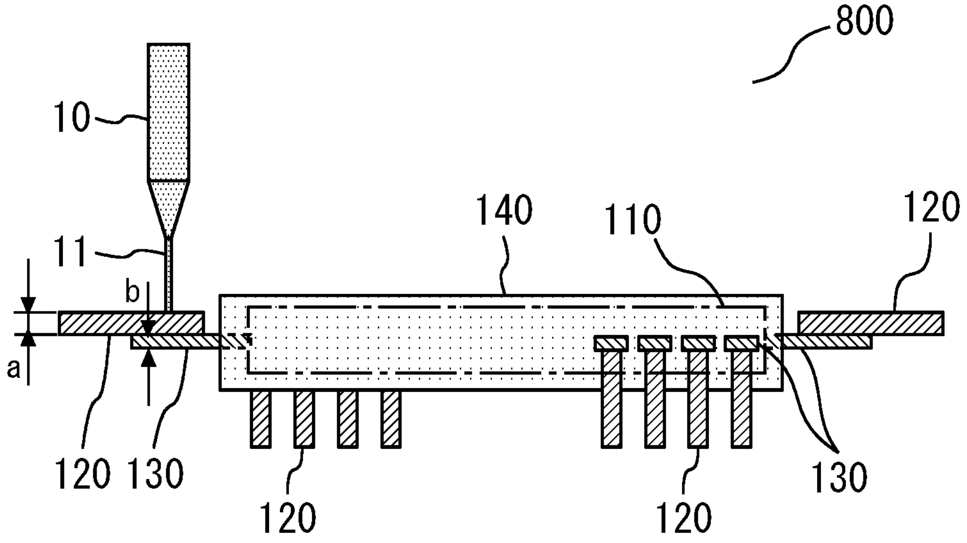
FIG. 11 is a view illustrating a method for manufacturing a semiconductor manufacturing apparatus according to an eighth embodiment of the present disclosure.

FIG. 11 is a view illustrating a method for manufacturing a semiconductor manufacturing apparatus 800 according to an eighth embodiment of the present disclosure. Manufacturing steps for the semiconductor manufacturing apparatus 800 include a first step and a second step as in the seventh embodiment. In addition, the thickness a of each second terminal 120 is greater than the thickness b of each first terminal 130.

Figure 12:
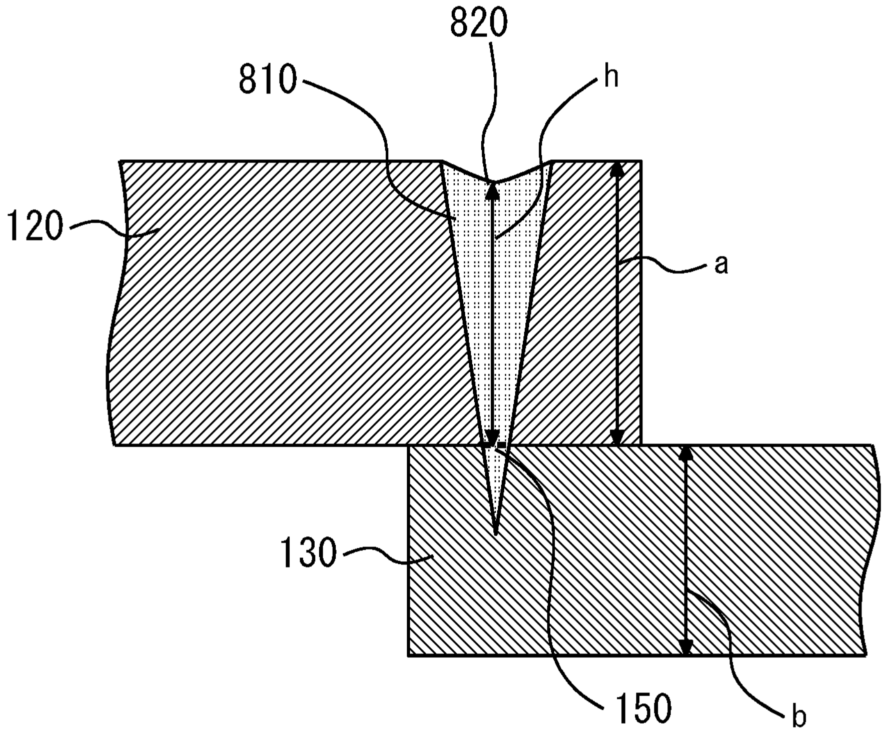
FIG. 12 is a schematic view illustrating a case where laser joining is performed by emitting the beam from the side of the second terminal according to the eighth embodiment of the present disclosure.

However, in the second step of the present embodiment, laser welding is performed by emitting the beam 11 from the side of the second terminal 120. FIG. 12 is a schematic view illustrating a case where laser joining is performed by emitting the beam 11 from the side of the second terminal 120 according to the eighth embodiment of the present disclosure. As illustrated in FIG. 12, a portion 810 of the second terminal 120 irradiated with a laser beam during laser welding has a dent 820 generated therein. Thus, the second terminal 120 has generated in its dent 820 a portion with a thickness h that is smaller than the original thickness a of the second terminal 120.

Herein, in the semiconductor manufacturing apparatus 800, the thickness a of each second terminal 120 needs to be greater than the thickness b of each first terminal 130 as described above. In the present embodiment, laser welding is performed from the side of the second terminal 120 that is thicker than the first terminal 130. Thus, even if the dent 820 is generated, the degree of the generated dent 820 can be suppressed as long as the laser 10 with the ordinary output is used. That is, it is possible to guarantee that the thickness h of the dent 820 is greater than or equal to the thickness b of the first terminal 130. Therefore, the semiconductor manufacturing apparatus 800 can be manufactured that can efficiently radiate heat, which has been generated by the semiconductor module 110, toward the second terminal 120.

As described above, the present disclosure can provide a semiconductor manufacturing apparatus and a method for manufacturing a semiconductor manufacturing apparatus that can suppress a temperature rise of the apparatus by devising the shapes of terminals.

The technical features described in the present disclosure may be combined as appropriate. Alternatively, some of the technical features of the present disclosure may be extracted to provide a new semiconductor manufacturing apparatus and a method for manufacturing the same that are different from those of the present disclosure.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2023-13151, filed on Jan. 31, 2023 including specification, claims, drawings and summary, on which the convention priority of the present application is based, is incorporated herein by reference in its entirety.

The invention claimed is:

1. A semiconductor manufacturing apparatus comprising:
- a semiconductor module including a semiconductor device;
- a sealing material adapted to seal the semiconductor module; and
- a second terminal to be arranged outside the sealing material, wherein
- the semiconductor module includes a first terminal that is electrically connected to the semiconductor device and extends to outside of the sealing material,
- the first terminal is joined to the second terminal outside the sealing material,
- a thickness of the second terminal in a direction perpendicular to a joined face of the first terminal and the second terminal is defined as a thickness of the second terminal,
- a thickness of the first terminal at a portion extending from the sealing material in the direction perpendicular to the joined face is defined as a thickness of the first terminal,
- the thickness of the second terminal is greater than the thickness of the first terminal,
- a first surface of the first terminal directly contacts the sealing material and includes the joined face of the first terminal, and
- a portion of the first surface of the first terminal that directly contacts the sealing material faces a same direction as the joined face of the first terminal.

2. A semiconductor manufacturing apparatus comprising:
- a semiconductor module including a semiconductor device;
- a sealing material adapted to seal the semiconductor module; and
- a second terminal to be arranged outside the sealing material, wherein
- the semiconductor module includes a first terminal that is electrically connected to the semiconductor device and extends to outside of the sealing material,
- the first terminal is joined to the second terminal outside the sealing material, and
- regarding the first terminal at a portion extending from the sealing material,
- a length from a boundary portion between the first terminal and the sealing material to a distal end of the first terminal is defined as a length of the first terminal,
- a width of the first terminal in a direction that is horizontal to the boundary portion and is perpendicular to a direction of the length is defined as a width of the first terminal,
- the length of the first terminal is shorter than the width of the first terminal, a first surface of the first terminal directly contacts the sealing material and includes the joined face of the first terminal, and a portion of the first surface of the first terminal that directly contacts the sealing material faces a same direction as the joined face of the first terminal.

3. The semiconductor manufacturing apparatus according to claim 1, wherein a cross-sectional area of the extending portion of the first terminal is smaller than an area of the joined face.

4. The semiconductor manufacturing apparatus according to claim 2, wherein a cross-sectional area of the extending portion of the first terminal is smaller than an area of the joined face.

5. The semiconductor manufacturing apparatus according to claim 1, wherein the sealing material includes a groove portion for securing a distance from the joined face.

6. The semiconductor manufacturing apparatus according to claim 2, wherein the sealing material includes a groove portion for securing a distance from the joined face.

7. The semiconductor manufacturing apparatus according to claim 1, wherein the thickness of the second terminal is different in a joined region including the joined face and in another region of the second terminal in contact with the joined region, and the thickness of the second terminal in the joined region is smaller than the thickness of the second terminal in the other region.

8. The semiconductor manufacturing apparatus according to claim 1, wherein the second terminal is partially cut off on a side of the joined face.

9. The semiconductor manufacturing apparatus according to claim 2, wherein the second terminal is partially cut off on a side of the joined face.

10. The semiconductor manufacturing apparatus according to claim 1, wherein the semiconductor device is formed of a wide-band-gap semiconductor.

11. The semiconductor manufacturing apparatus according to claim 2, wherein the semiconductor device is formed of a wide-band-gap semiconductor.

* * * * *